United States Patent
Park et al.

(10) Patent No.: US 8,269,561 B1
(45) Date of Patent: Sep. 18, 2012

(54) SYSTEMS AND METHODS FOR CMOS POWER AMPLIFIERS WITH POWER MODE CONTROL

(75) Inventors: Yunseo Park, Norcross, GA (US); Chang-Ho Lee, Marietta, GA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 0 days.

(21) Appl. No.: 13/104,898

(22) Filed: May 10, 2011

(51) Int. Cl.
 *H03F 3/04* (2006.01)
(52) U.S. Cl. .................................... 330/301; 330/124 R
(58) Field of Classification Search ............... 330/84, 330/124 R, 295, 301
See application file for complete search history.

(56) References Cited

U.S. PATENT DOCUMENTS 7,242,245 B2 * 7/2007 Burns et al. ............... 330/124 R
* cited by examiner

*Primary Examiner* — Khanh V Nguyen

(57) ABSTRACT

Embodiments of the invention may provide CMOS power amplifiers with power mode control to provide the desired power-added efficiency (PAE), idle current, output power, and Adjacent Channel Leakage Ratio (ACLR). For instance, there may be a multi-mode WCDMA CMOS RF power amplifier having high/medium/low output power modes aimed to achieve high PAE and low idle current in a portable wireless environment. According to an example embodiment, a CMOS RF power amplifier may provide a plurality of separate signal paths for purposes of supporting multi-power modes. For example, there may be a first signal path which supports a high-power mode, and a second path which is subsequently divided into two recursive signal paths or sub-paths to support respective medium and low-power modes. One of the three power modes may be selected or controlled using bias control switches in the first and second paths.

20 Claims, 6 Drawing Sheets

SYSTEMS AND METHODS FOR CMOS POWER AMPLIFIERS WITH POWER MODE CONTROL

FIELD OF THE INVENTION

Embodiments of the invention relate generally to efficient multi-power mode power amplifiers, and more particularly to systems and methods for complementary metal oxide semiconductor (CMOS) power amplifiers with power mode control.

BACKGROUND OF THE INVENTION

A power amplifier (PA) for mobile application is one of the largest power consuming components used in handsets and other mobile devices. Considering the nature of handheld devices and mobile devices, a PA needs to have (1) high power-added efficiency (PAE), (2) low idle current, and (3) low spectrum leakage. The first two features are required for longer battery life while the last feature needs to be ensured for co-existence with other wireless standards. The standard Wideband Code Division Multiple Access (WCDMA) system employs non-constant envelope modulation and frequency division access. As a result, a WCDMA PA needs to be linear enough to support a non-constant envelope and has to have low idle current since frequency division access needs the PA to be on for the whole talk time or use time unlike the time division access system. In order to preserve battery life, a portable WCDMA PA is recommended to have three power modes: low-, middle- and high-power mode. With a detailed level of power mode, a WCDMA PA can reduce power consumption through the excess power being cut down based on the information provided from baseband.

PAs used in WCDMA mobile handsets have tough requirements so III-V semiconductors such as gallium arsenide (GaAs) have been major candidate for power amplifiers due to their superior power handling performance in contrast to those implemented using a silicon-based process like CMOS. However, CMOS provides the feasibility of integration with baseband and other circuitry that are already designed on a CMOS process, which lowers cost and gives a competitive edge to the manufacturer. Notwithstanding, CMOS suffers from an intrinsic low transconductance, low breakdown voltage and high knee voltage, all of which make the design of CMOS power amplifiers challenging. Accordingly, there is an opportunity in the industry for systems and methods for CMOS power amplifiers with power mode control.

SUMMARY OF THE INVENTION

According to an example embodiment of the invention, there is a system. The system may include at least one differential amplifier for receiving differential inputs derived from a single-ended system input at a system input port, where the at least one differential amplifier generates a first differential output signal along a first signal path and a second differential output signal along a second signal path. The system may also include an output network comprising at least an inductor and a capacitor configured in parallel, where the inductor is positioned along the first signal path for receiving the first differential output signal and the capacitor is positioned along the second signal path for receiving the second differential output signal, where the output network is for combining the first differential output signal and the second differential output signal to provide a first singled-ended output to a system output port. The system may further include a first single-ended power amplifier for receiving the single-ended system input and for generating a second single-ended output, where the second single-ended output or a third single-ended output derived from the second single-ended output is for delivery to the output port via the second signal path that includes the capacitor.

According to an example embodiment of the invention, there is a method. The method may include receiving, by at least one differential amplifier, differential inputs derived from a single-ended system input at a system input port, where the at least one differential amplifier generates a first differential output signal along a first signal path and a second differential output signal along a second signal path; providing an output network comprising at least an inductor and a capacitor configured in parallel, wherein the inductor is positioned along the first signal path for receiving the first differential output signal and the capacitor is positioned along the second signal path for receiving the second differential output signal, where the output network is for combining the first differential output signal and the second differential output signal to provide a first singled-ended output to a system output port; receiving, by a first single-ended power amplifier, the single-ended system input and generating, by the first single-ended power amplifier, a second single-ended output, where the second single-ended output or a third single-ended output derived from the second single-ended output is for delivery to the output port via the second signal path that includes the capacitor; and enabling or disabling the at least one differential amplifier or the first single-ended power amplifier in accordance with respective modes of operation.

BRIEF DESCRIPTION OF THE DRAWING

Figure 1:
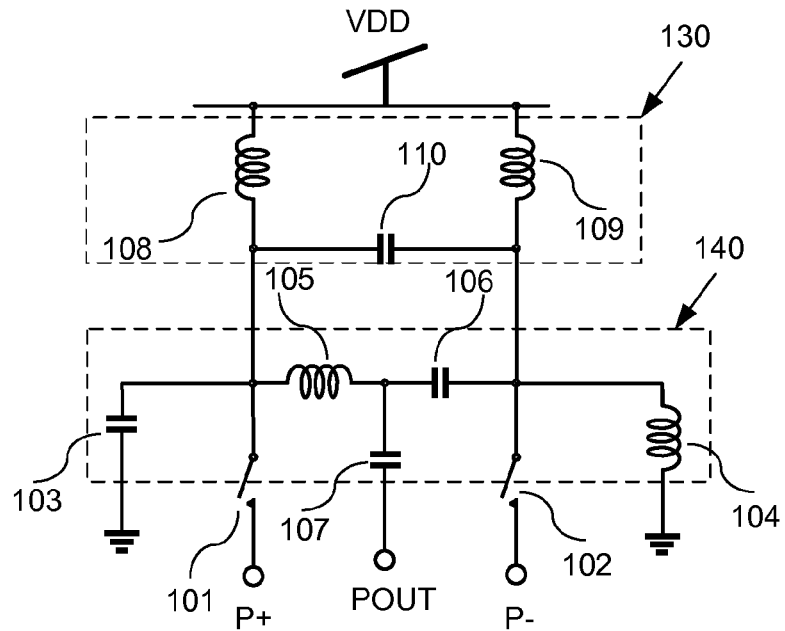

Having thus described the invention in general terms, reference will now be made to the accompanying drawings, which are not necessarily drawn to scale, and wherein:

FIG. 1 illustrates a schematic of an example output network for use with a CMOS radio frequency (RF) power amplifier, according to an example embodiment of the invention.

Figure 2:
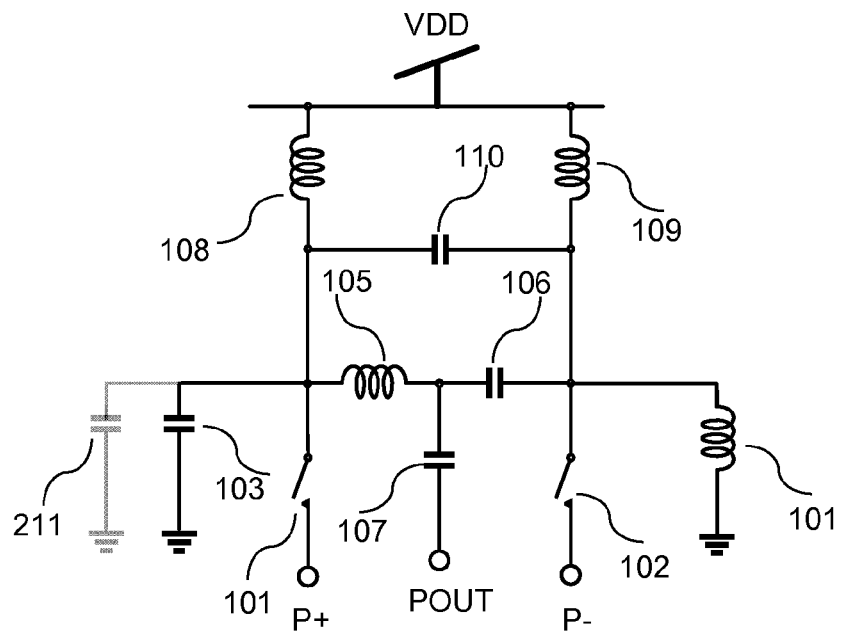

FIG. 2 illustrates a schematic showing the addition of a capacitive power path to the output network of FIG. 1, according to an example embodiment of the invention.

Figure 3:
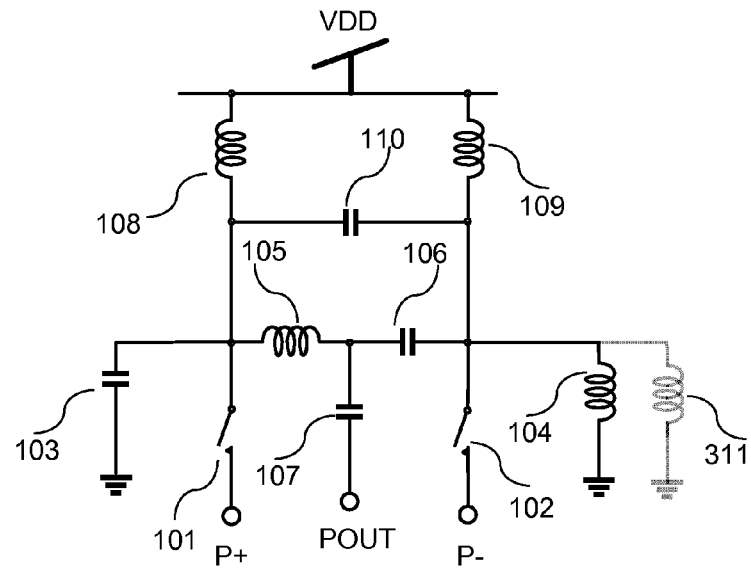

FIG. 3 illustrates a schematic showing the addition of an inductive power path to the output network of FIG. 1, according to an example embodiment of the invention.

Figure 4:
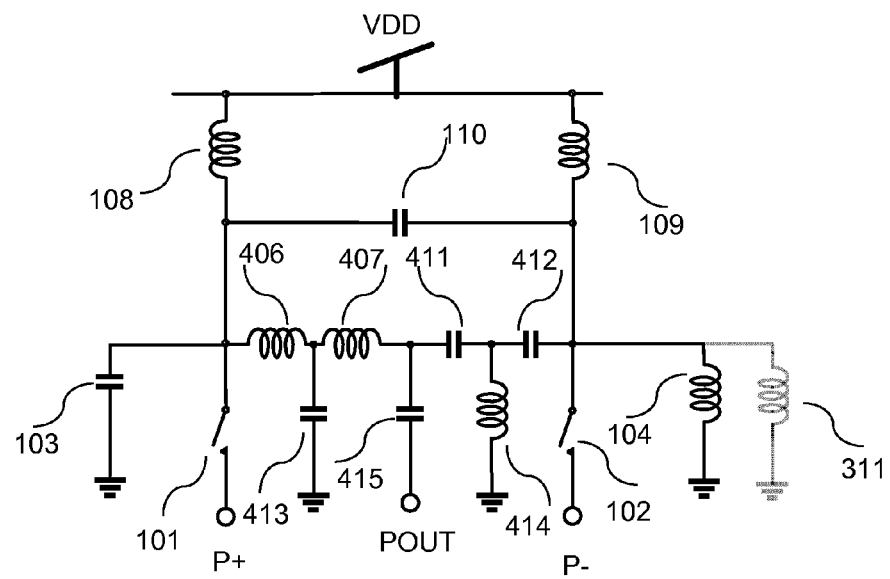

FIG. 4 shows a variation of the schematic diagram of FIG. 3, where the bandwidth of operation of an LC power combining network can be extended using an additional matching network, which may be utilized when the output impedance of the added power path is inductive in nature, according to an example embodiment of the invention.

Figure 5:
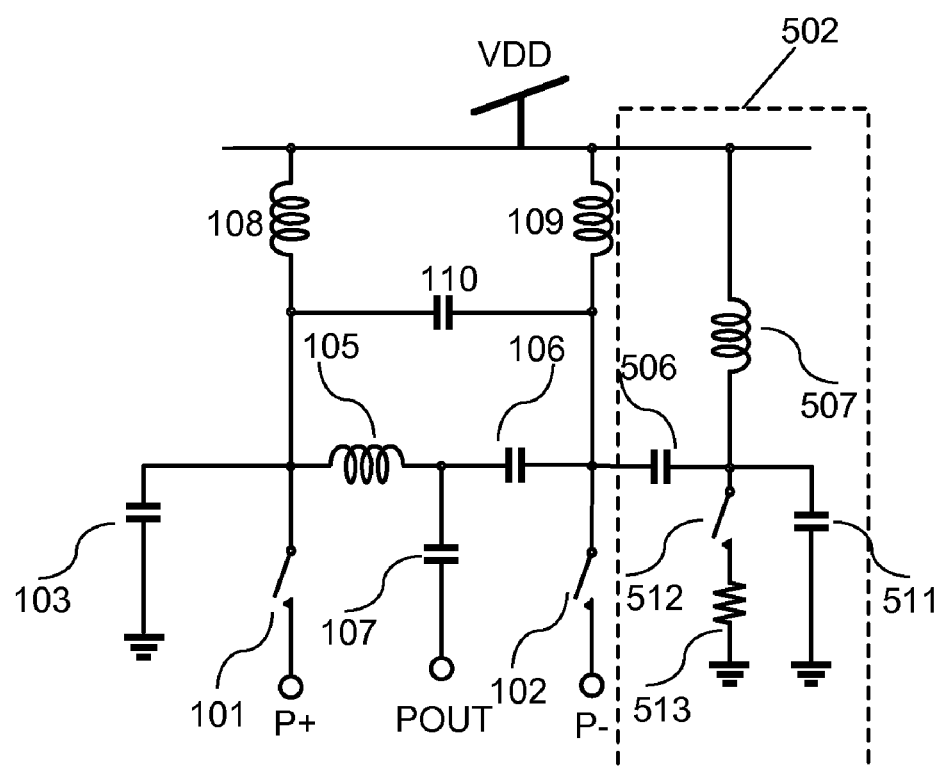

FIG. 5 is a schematic diagram of an LC output matching network with the power amplifier (PA) core depicted as switches, including details of power addition from a separate path, which shows parasitic of inductance, according to an example embodiment of the invention.

Figure 6A:
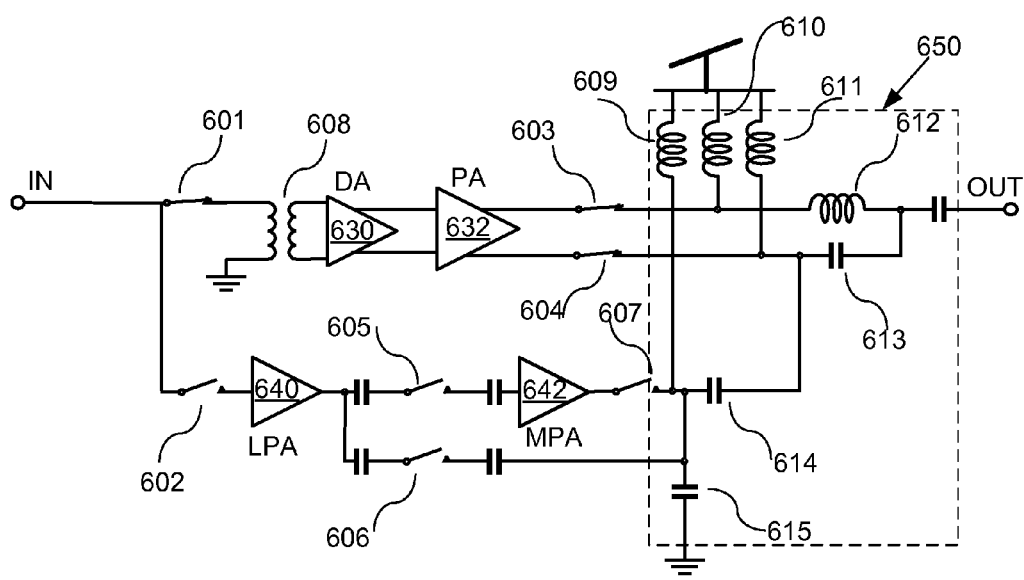

FIG. 6A is a schematic diagram of a high-power mode operation of a multi-power-mode power amplifier with an LC output power combining network, according to an example embodiment of the invention.

Figure 6B:
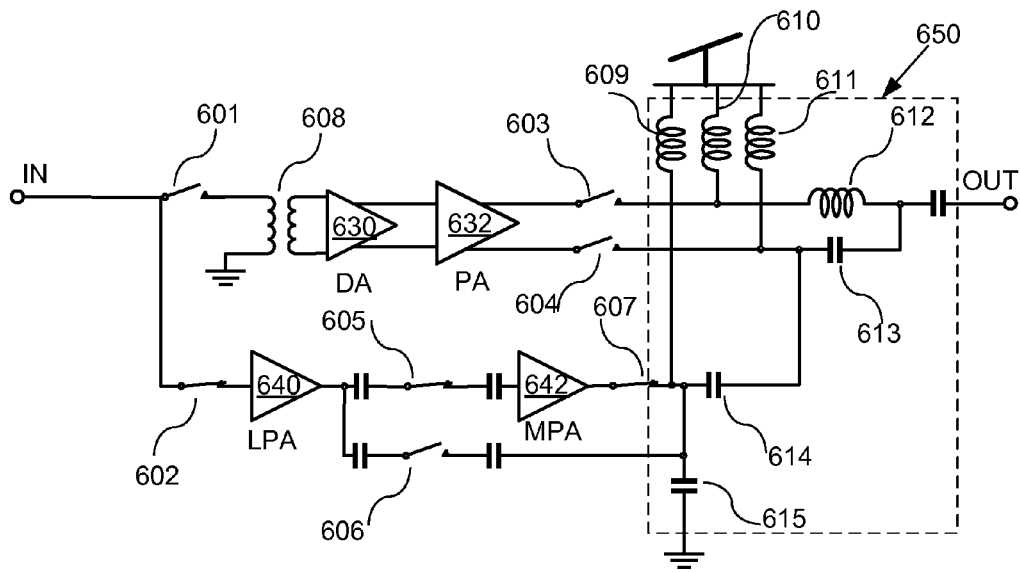

FIG. 6B is a schematic diagram of a medium-power-mode operation of a multi-power-mode power amplifier with an LC output power combining network, according to an example embodiment of the invention.

Figure 6C:
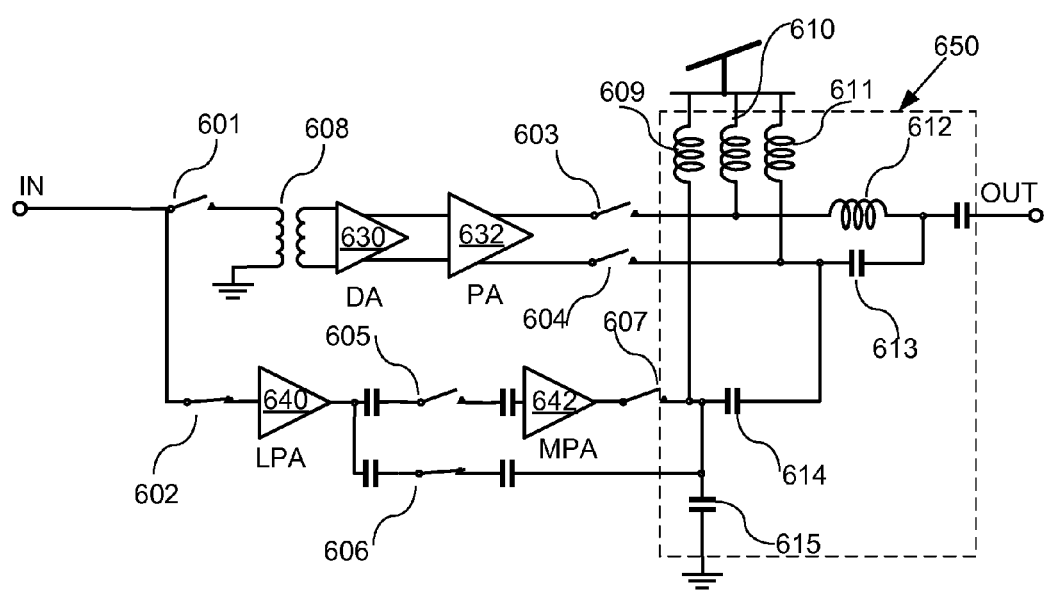

FIG. 6C is a schematic diagram of a low-power mode operation of a multi-power-mode power amplifier with an LC output power combining network, according to an example embodiment of the invention.

Figure 7:
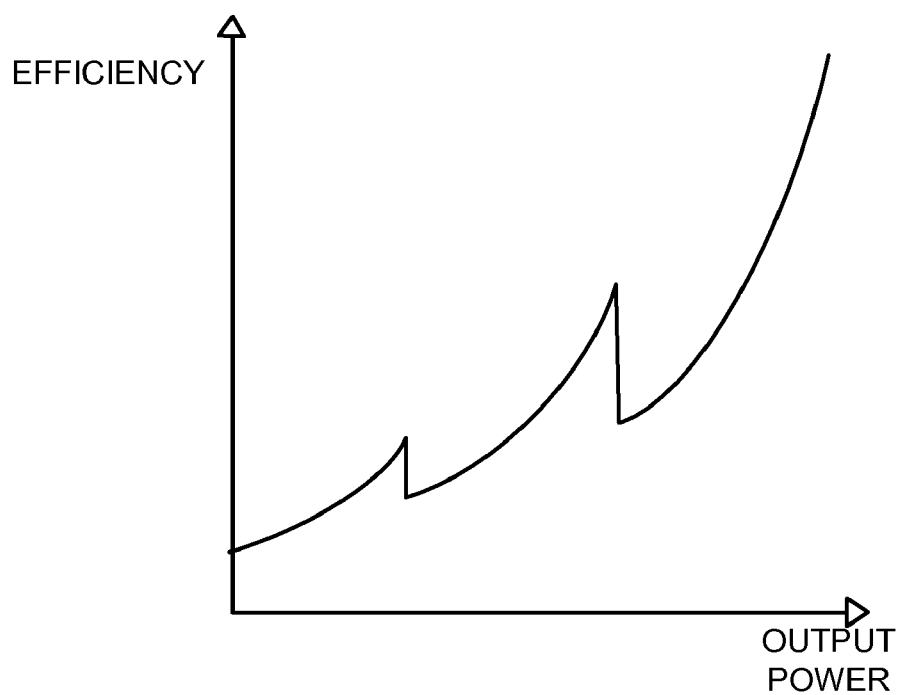

FIG. 7 illustrates the output power and efficiency of an example power amplifier in accordance with an example embodiment of the invention.

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide CMOS power amplifiers with power mode control to provide the desired power-added efficiency (PAE), idle current, output power, and Adjacent Channel Leakage Ratio (ACLR). For instance, there may be a multi-mode WCDMA CMOS RF power amplifier having high/medium/low output power modes aimed to achieve high PAE and low idle current in a portable wireless environment. According to an example embodiment, a CMOS radio frequency (RF) power amplifier may provide a plurality of separate signal paths for purposes of supporting multi-power modes. For example, there may be a first signal path which supports a high-power mode, and a second path which is subsequently divided into two recursive signal paths or sub-paths to support respective medium and low-power modes. One of the three power modes may be selected or controlled using bias control switches in the first and second paths. It will be appreciated that the threshold cutoffs for high power, medium power, and low power may vary without departing from example embodiments of the invention. However, in general, high power is greater than medium power, which in turn is greater than low power, according to an example embodiment of the invention. In some example embodiments, there may be some overlap between a high-power level and a medium-power level, as well as between a medium-power level and a low-power level, according to an example embodiment of the invention.

A CMOS RF power amplifier in accordance with an example embodiment of the invention may be comprised of an input balun, one or more driver stages, low/middle/high power PA stages, and an output network that provides impedance transformation during the high-output power modes and the lower/middle-output power modes. The output network may be configured to perform impedance transformation based upon the selected power mode. A power mode selection may be controlled by switches and bias control, according to an example embodiment of the invention.

FIG. 1 illustrates a schematic of an example output network for use with a CMOS RF power amplifier, according to an example embodiment of the invention. The example output network may be utilized as an impedance transformation network between one or more input ports (e.g., differential inputs P+ and P−) and an output port (e.g., POUT). In an example embodiment of the invention, the input ports may be at a relatively low impedance while the output port may be at a higher impedance such as 50 ohms, according to an example embodiment of the invention.

In FIG. 1, the switches 101, 102 may be representative of a differential power amplifier core or stage that can provide respective input signals to the differential input ports P+ and P− of the output network. Still referring to FIG. 1, the example output network further illustrates a resonant block 130, which comprises inductors 108, 109, and capacitor 110. In an example embodiment of the invention, the capacitor 110 may be utilized to provide parallel resonance with inductors 108, 109. The parallel resonance of the resonant block 130 may operate to provide high impedance at a required frequency similar to that typically provided by RF choke inductors. Indeed, the resonant block 130 may be utilized instead of RF choke inductors where there may not be sufficient area for formation of RF choke inductors.

It will be appreciated that the inductors 108, 109 may be implemented on-chip or via bonding inductors or bondwire inductors, which would not have sufficient inductance to operate as RF choke inductors. Likewise, bonding inductors or bondwire inductors can be implemented in a small area in a CMOS process. Accordingly, the resonant block 130 may function as an RF choke inductor without requiring the larger area required by an RF choke inductor. Indeed, a size of the combined power amplifier and output network can be greatly reduced when implemented in an integrated circuit (IC) process without requiring additional external components. It will also be appreciated that a DC voltage supply VDD can be provided via the inductors 108, 109 for biasing one or more transistors/amplifiers of a power amplifier core or stage.

The output network of FIG. 1 may also include an LC power combining network 140 comprising one or more inductors 104, 105 and capacitors 103, 106, which operate to combine differential inputs received from differential ports P+, P− into a singled-ended output signal for delivery to the example single-ended output signal port POUT via DC blocking capacitor 107. It will be appreciated that when viewed from the switches 101, 102, the impedance provided by inductor 105 and capacitor 106 may have both real and imaginary components. Accordingly, capacitor 103 and inductor 104 may be included with the LC power combining network to cancel out the respective imaginary components of the resistance that would otherwise be seen from the respective switches 101, 102.

FIG. 2 illustrates a schematic showing the addition of another power path to the output network of FIG. 1, according to an example embodiment of the invention. The added power path may be needed to provide one or more power modes beyond that provided by the main power amplifier core or stage via switches 101, 102. For example, the added power path may supply the appropriate single-ended inputs for delivery to the output port POUT during a low-power mode or a medium-power mode. These single-ended inputs can be received from the outputs of a low PA stage or a medium PA stage, according to an example embodiment of the invention. On the other hand, the switches 101, 102 can be used by the output network to receive differential signals during a high-power mode.

In FIG. 2, the output impedance of the added power path, for example, from a low-power or medium-power amplifier stage, may be capacitive in nature, and thus, may be represented by a capacitor 211 in parallel with the capacitor 103. Because the capacitance of capacitor 211 can be absorbed into the necessary part of reactance by the LC power combining network, the addition of a separate path does not affect the performance of the main PA such as linearity. Accordingly, the addition of a separate power path that is capacitive in nature can be incorporated into the LC power combining network without disturbing an existing LC power combining network or otherwise requiring additional matching components, according to an example embodiment of the invention.

FIG. 3 illustrates a schematic showing the addition of a power path to the output network of FIG. 1. However, in comparison to FIG. 2, the output impedance of the added power path in FIG. 3 may be inductive in nature, and thus, may be represented by an inductor 311 in parallel with the inductor 104. It will be appreciated that in many cases, the output impedance of a low-power amplifier stage or a medium-power amplifier stage may be inductive in nature, as represented by inductor 311 in FIG. 3. In FIG. 3, the added power path can utilize the capacitive side (capacitor 106) of the LC power combining network for delivering the single-ended signal to the output port POUT, according to an example embodiment of the invention. FIGS. 6A-6C illustrate in further detail the addition of a power path for low- and medium-power amplifier stages that are inductive in nature, as described in further detail herein.

FIG. 4 shows a variation of the schematic diagram of FIG. 3, according to an example embodiment of the invention. In particular, in FIG. 4, the bandwidth of operation of the LC power combining network can be extended using an additional matching network, which may be utilized when the output impedance of the added power path is inductive in nature. In FIG. 4, the inductor 105 of FIG. 3 has been replaced with inductors 406, 407 and capacitor 413 configured in a T-configuration. Likewise, in FIG. 4, the capacitor 106 of FIG. 3 has been replaced with capacitors 411, 412, and inductor 414 in a T-configuration, according to an example embodiment of the invention. It will be appreciated that by adding additional matching networks, the bandwidth of power combining by the LC power combining network can be increased, according to an example embodiment of the invention.

FIG. 5 illustrates a variation of the schematic of FIG. 3, according to an example embodiment of the invention. In particular, in FIG. 5, there is a separate added path 502 associated with switch 512. For example, the switch 512 may supply the appropriate single-ended signal generated from a low-power amplifier stage or a medium-power amplifier stage. The separate added path 502 may have a load inductance 507, which may be associated with either the low-power amplifier stage or the medium-power amplifier stage, and is therefore an adjustable design parameter, according to an example embodiment of the invention. If the load inductance 507 of the added path is greater than the combined capacitance of capacitors 506 and 511 (part of the LC combining network), then the total reactance may be inductive in nature. In other words, as long as the network comprising capacitor 506, inductor 507, and capacitor 511 shows a necessary inductance that cancels the imaginary impedance for switch 512 (e.g., representing a transistor of a high-power amplifier stage) to see a real impedance, the inductance 311 shown in FIG. 3 can be absorbed into the load inductance 507. In this way, the addition of a path for a low-power amplifier stage or a medium-power amplifier stage can eliminate the inductor 311 in FIG. 3 without degrading any significant performance. Since the inductor occupies a large area in IC implementation, this space savings can provide one or more advantages of a smaller area and lower cost.

FIG. 6A illustrates a schematic of an example CMOS power amplifier with power mode control, according to an example embodiment of the invention. The example CMOS may support at least three power modes—a high-power mode, a medium-power mode, and a low-power mode, according to an example embodiment of the invention. In FIG. 6A, there is a first signal path that supports a high-power mode. The first signal path may operate differentially, according to an example embodiment of the invention. In particular, the first signal path may comprise a balun 601 or other input transformer, a driver amplifier stage 630, and a power amplifier stage 632. On the other hand, the second signal path may support both a medium-power mode and a low-power mode. To do so, the second signal path can be divided into two recursive signal sub-paths to support the respective medium and low-power modes. In particular, the second signal path can include a low-power amplifier stage 640. The output of the low-power amplifier stage 640 may be split between two sub-paths, according to an example embodiment of the invention. During a medium-power mode, a first sub-path (via switch 605) can provide the output of the low-power amplifier stage 640 as an amplified input to the medium-power amplifier stage 642 for additional amplification. On the other hand, during a low-power mode, a second sub-path (via switch 606) can allow the output of the low-power amplifier stage 640 to bypass the medium-power amplifier stage 642, according to an example embodiment of the invention. It will be appreciated that the high-power mode signal path may be implemented using differential circuits in order to improve linearity while separate paths for low/middle-power mode may be single-ended for purposes of efficiency, according to an example embodiment of the invention.

FIG. 6A illustrates an operation of the example CMOS power amplifier in a high-power mode, according to an example embodiment of the invention. For this high-power mode, the switches 601, 603, 604 for the first signal path are closed while switches 602, 605, 606 for the second signal path are opened. Accordingly, the single-ended input signal from the input (IN) port may be received by a balun 608 or other input transformer, which may convert the single-ended input signal into differential input signals. The differential input signal may be received by a differential driver amplifier stage 630 comprising one or more driver amplifiers. The driver amplifier stage 630 may be utilized to amplify the differential input signals to an input range or level of the high-power amplifier stage 632, which may comprise one or more differential amplifiers. The output of the power amplifier stage 632 may comprise amplified differential signals that are combined by an LC output network, which may comprise inductor 612 and capacitor 613, to generate a single-ended signal for delivery to the output port (OUT). In an example embodiment, the example LC output network comprising inductor 612 and capacitor 613 may also be configured as an impedance transformation network to transform a low impedance at the output of the high power amplifier stage 632 to a higher impedance such as 50 ohms, according to an example embodiment of the invention. It will be appreciated that the inductors 610, 611 may be part of a resonant block (perhaps with a connecting capacitor (not shown) to provide functionality similar to RF choke inductors, and may be utilized to supply a DC voltage supply for biasing one or more transistors/amplifiers in driver amplifier stage 630 and/or power amplifier stage 632 during a high-power mode of operation, according to an example embodiment of the invention. It will also be appreciated that the switches described herein, including switches 601-606, may be implemented as transistor switches that can be opened or closed in accordance with bias controls, according to an example embodiment of the invention.

FIG. 6B illustrates an operation of the example CMOS power amplifier in a medium-power mode, according to an example embodiment of the invention. In FIG. 6B, the medium-power mode of operation is enabled by disconnecting switches on a high-power path/low-power sub-path and connecting switches on a medium-power sub-path. Accordingly, during the medium-power mode, the switches 601, 603, 604 can be opened to isolate the high-power signal path from the output port OUT. In addition, switches 602, 605 in the second signal path/first sub-path may be closed, while switch 606 in the second sub-path may be open. Thus, during the medium-power mode, the single-ended input signal from the input port (IN) may be received by the low-power amplifier stage 640. The output of the low-power amplifier stage 640 can be delivered as an input to the medium-power amplifier stage 642. The output of the medium-power amplifier stage 642, which is a single-ended output signal, can be connected to the capacitive side (capacitor 613) of the LC output network utilized by high-power mode signal path. Thus, the output of the medium-power amplifier stage 642 can be delivered to the output port OUT as the medium-power mode output signal via the capacitor 613 of the LC load-combining network. It will be appreciated that the capacitors 613, 614, 615 can operate as DC blocking capacitors during the medium-power mode of operation, according to an example embodiment of the invention. It will also be appreciated that the inductor 609 may operate as load inductance, and likewise be utilized to supply a DC voltage supply for biasing one or more transistors/amplifiers in low-power amplifier stage 640 and/or medium-power amplifier stage 642 during a medium-power mode of operation, according to an example embodiment of the invention.

FIG. 6C illustrates an operation of the example CMOS power amplifier in a low-power mode, according to an example embodiment of the invention. In FIG. 6C, the low-power mode of operation is enabled by disconnecting switches on high-power path/medium-power sub-path and connecting switches on the low-power sub-path. Accordingly, during the low-power mode, the switches 601, 603, 604 can be opened to isolate the high-power signal path from the output port OUT. In addition, switches 602, 606 in the second signal path/second sub-path may be closed, while switch 605 in the first sub-path may be open. Thus, during the low-power mode, the single-ended input signal from the input port (IN) may be received by the low-power amplifier stage 640. The output of the low-power amplifier stage 640 can be connected to the capacitive side (capacitor 613) of the LC output network utilized by the high-power mode signal path. Thus, the output of the low-power amplifier stage 640 can be delivered to the output port OUT as the low-power mode output signal via the capacitor 613 of the LC load-combining network. It will be appreciated that the capacitors 614, 615 can operate as DC blocking capacitors during the low-power mode of operation, according to an example embodiment of the invention. It will also be appreciated that the inductor 609 may operate as a load inductance, and likewise be utilized to supply a DC voltage supply for biasing one or more transistors/amplifiers in the low-power amplifier stage 640 during a low-power mode of operation, according to an example embodiment of the invention.

It will be appreciated that the CMOS amplifier described in FIGS. 6A-6C may be implemented in a CMOS process, perhaps in an IC, according to an example embodiment of the invention. For example, switches 601-606 may be implemented as switching transistors such as metal-oxide-semiconductor (MOS) transistors to facilitate their implementation in a CMOS process. Similarly, the amplifier stages 630, 632, 640, 642 can likewise be implemented using MOS transistors (e.g., MOSFETs, etc.) or other transistors to facilitate their implementation in CMOS. Likewise, inductors 610, 611 can be implemented as bonding inductors that can be implemented in CMOS. Likewise other inductors and capacitors can likewise be implemented in CMOS, according to an example embodiment of the invention. It will be appreciated that many variations of the operations of the example CMOS power amplifier in FIGS. 6A-6C are available without departing from example embodiments of the invention.

FIG. 7 illustrates the overall efficiency of the example embodiment over output power level, according to an example embodiment of the invention. In particular, FIG. 7 illustrates the overall efficiency for a respective low-power mode, a medium-power mode, and a high-power mode, according to an example embodiment of the invention.

Many modifications and other embodiments of the invention set forth herein will come to mind to one skilled in the art to which these inventions pertain having the benefit of the teachings presented in the foregoing descriptions and the associated drawings. Therefore, it is to be understood that the inventions are not limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system, comprising:
   at least one differential amplifier for receiving differential inputs derived from a single-ended system input at a system input port, wherein the at least one differential amplifier generates a first differential output signal along a first signal path and a second differential output signal along a second signal path;
   an output network comprising at least an inductor and a capacitor configured in parallel, wherein the inductor is positioned along the first signal path for receiving the first differential output signal and the capacitor is positioned along the second signal path for receiving the second differential output signal, wherein the output network is for combining the first differential output signal and the second differential output signal to provide a first singled-ended output to a system output port; and
   a first single-ended power amplifier for receiving the single-ended system input and for generating a second single-ended output, wherein the second single-ended output or a third single-ended output derived from the second single-ended output is for delivery to the output port via the second signal path that includes the capacitor.

2. The system of claim 1, further comprising:
   a second single-ended power amplifier for receiving the single system input and generating the third single-ended output for delivery to the system output port via the second signal path that includes the capacitor.

3. The system of claim 2, wherein the at least one differential amplifier is operated during a high-power mode, wherein the first and second single-ended power amplifiers are operate during a medium-power mode, and wherein the first single-ended power amplifier is operated during a low-power mode.

4. The system of claim 2, further comprising:
   a plurality of switches for selectively connecting and disconnecting the at least one differential amplifier, the first single-ended power amplifier, and the second single-ended power amplifier from the output port.

5. The system of claim 2, wherein the at least one differential amplifier, the output network, and the first single-ended power amplifier are implemented in accordance with a CMOS process.

6. The system of claim 1, wherein the second single-ended output is delivered to the output port via the second signal path during a low-power mode, and wherein the third single-ended output derived from the second single-ended output is delivered to the output port via the second signal path during a medium-power mode.

7. The system of claim 1, wherein the at least one differential amplifier includes a driver differential amplifier and a differential power amplifier, and wherein a balun is utilized to convert the system input at the system input port to differential inputs.

8. The system of claim 1, wherein the output network further transforms an output impedance of the at least one differential amplifier to an impedance at the system output port.

9. The system of claim 1, further comprising:
a DC blocking capacitor connected to the system output port.

10. The system of claim 1, wherein a DC supply voltage is connected to the first and second signals path via respective inductors, wherein the DC supply voltage is for biasing transistors of the at least one differential amplifier.

11. A method, comprising:
receiving, by at least one differential amplifier, differential inputs derived from a single-ended system input at a system input port, wherein the at least one differential amplifier generates a first differential output signal along a first signal path and a second differential output signal along a second signal path;
providing an output network comprising at least an inductor and a capacitor configured in parallel, wherein the inductor is positioned along the first signal path for receiving the first differential output signal and the capacitor is positioned along the second signal path for receiving the second differential output signal, wherein the output network is for combining the first differential output signal and the second differential output signal to provide a first single-ended output to a system output port;
receiving, by a first single-ended power amplifier, the single-ended system input and generating, by the first single-ended power amplifier, a second single-ended output, wherein the second single-ended output or a third single-ended output derived from the second single-ended output is for delivery to the output port via the second signal path that includes the capacitor; and
enabling or disabling the at least one differential amplifier or the first single-ended power amplifier in accordance with respective modes of operation.

12. The method of claim 11, further comprising:
receiving, by a second single-ended power amplifier, the single system input and generating, by the second single-ended power amplifier, the third single-ended-output for delivery to the system output port via the second signal path that includes the capacitor.

13. The method of claim 12, wherein the at least one differential amplifier is operated during a high-power mode, wherein the first and second single-ended power amplifiers are operate during a medium-power mode, and wherein the first single-ended power amplifier is operated during a low-power mode.

14. The method of claim 12, further comprising:
providing a plurality of switches for selectively connecting and disconnecting the at least one differential amplifier, the first single-ended power amplifier, and the second single-ended power amplifier from the output port.

15. The method of claim 12, wherein the at least one differential amplifier, the output network, and the first single-ended power amplifier are implemented in accordance with a CMOS process.

16. The method of claim 11, wherein the second single-ended output is delivered to the output port via the second signal path during a low-power mode, and wherein the third-single ended output derived from the second single-ended output is delivered to the output port via the second signal path during a medium-power mode.

17. The method of claim 11, wherein the at least one differential amplifier includes a driver differential amplifier and a differential power amplifier, and wherein a balun is utilized to convert the system input at the system input port to differential inputs.

18. The method of claim 11, wherein the output network further transforms an output impedance of the at least one differential amplifier to an impedance at the system output port.

19. The method of claim 11, further comprising:
providing a DC blocking capacitor connected to the system output port.

20. The method of claim 11, wherein a DC supply voltage is connected to the first and second signal path via respective inductors, wherein the DC supply voltage is for biasing transistors of the at least one differential amplifier.

* * * * *